(12) United States Patent
Cowley et al.

(10) Patent No.: US 7,492,222 B2
(45) Date of Patent: Feb. 17, 2009

(54) COMPOUND AUTOMATIC GAIN CONTROL

(75) Inventors: Nick Cowley, Wroughton (GB); Mark Mudd, Wootton Bassett (GB)

(73) Assignee: Intel Corporation, Santa Clara, CA (US)

( * ) Notice: Subject to any disclaimer, the term of this patent is extended or adjusted under 35 U.S.C. 154(b) by 141 days.

(21) Appl. No.: 11/479,879

(22) Filed: Jun. 30, 2006

(65) Prior Publication Data
US 2008/0001664 A1    Jan. 3, 2008

(51) Int. Cl.
*H03F 3/68* (2006.01)
(52) U.S. Cl. .................... 330/124 R; 330/254
(58) Field of Classification Search ............. 330/124 R, 330/254, 278, 279, 295
See application file for complete search history.

(56) References Cited

U.S. PATENT DOCUMENTS

| | | | | | |
|---|---|---|---|---|---|
| 3,969,683 | A | * | 7/1976 | Fabricius | ................... 330/144 |
| 4,549,152 | A | * | 10/1985 | Kumar | ....................... 332/144 |
| 4,641,361 | A | * | 2/1987 | Rosback | ..................... 381/103 |
| 5,796,306 | A | * | 8/1998 | Tsumura | ................. 330/124 R |
| 6,140,849 | A | * | 10/2000 | Trask | .......................... 327/113 |
| 6,300,845 | B1 | * | 10/2001 | Zou | ............................. 332/178 |
| 6,316,996 | B1 | * | 11/2001 | Puotiniemi | .................. 330/254 |
| 7,075,372 | B2 | * | 7/2006 | Juang et al. | ................. 330/279 |
| 7,138,867 | B2 | * | 11/2006 | Suzuki et al. | ............... 330/254 |

\* cited by examiner

*Primary Examiner*—Henry K Choe
(74) *Attorney, Agent, or Firm*—Dana B. Lemoine; Lemoine Patent Services, PLLC

(57) ABSTRACT

A compound automatic gain control (AGC) circuit includes multiple AGC stages coupled with signal input nodes and signal output nodes in parallel. Each of the AGC stages has separate, individually controllable, control inputs. During gain back off, the AGC stages are backed off in sequence.

5 Claims, 5 Drawing Sheets

COMPOUND AUTOMATIC GAIN CONTROL

FIELD

The present invention relates generally to amplifier circuits, and more specifically to automatic gain control (AGC) circuits.

BACKGROUND

Radio Frequency (RF) automatic gain control (AGC) circuits are often used to provide a substantially constant output signal amplitude from a varying input signal amplitude. AGC circuits are typically variable gain circuits that increase gain when the output signal amplitude needs to increase, and decrease gain when the output signal amplitude needs to decrease. "Gain back off" is a term used to describe reducing gain in an AGC circuit. AGC circuit performance may be measured using various criteria as a function of gain back off. For example, noise figure (NF) versus gain back off may be used as a performance measure. Also for example, intermodulation intercepts versus gain back off may be used as a performance measure.

DESCRIPTION OF EMBODIMENTS

Figure 1:
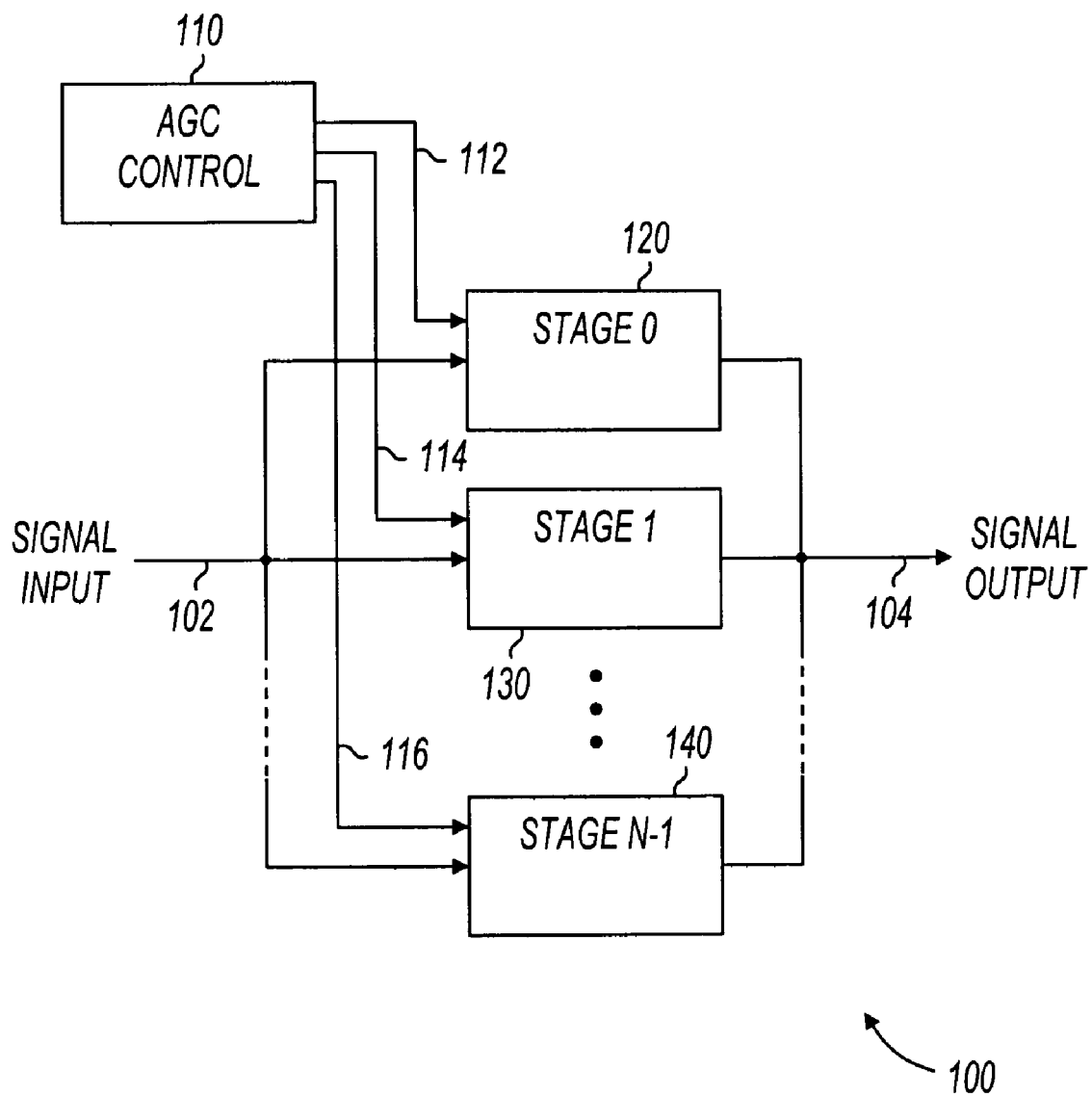
FIG. 1 shows a compound automatic gain control circuit having N stages.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a compound automatic gain control circuit having N stages. Compound AGC circuit 100 includes AGC stages 120, 130, and 140, labeled as STAGE 0, STAGE 1, and STAGE N-1, respectively. Compound AGC circuit 100 also includes AGC control circuit 110. Each of the AGC stages is coupled to receive an input signal in parallel on signal input node 102. Each of the AGC stages is also coupled to provide an output signal in parallel on signal output node 104. FIG. 1 shows "N" parallel coupled AGC stages, but this is not a limitation of the present invention. For example, any number of AGC stages may be included in parallel without departing from the scope of the present invention.

AGC control circuit 110 provides independent AGC control signals to the various parallel connected AGC stages. For example, AGC control circuit 110 provides a first AGC control signal to STAGE 0 on node 112; a second AGC control signal to STAGE 1 on node 114; and a third AGC control signal to STAGE N-1 on node 116. Compound AGC circuit 100 may include any number of parallel coupled stages, and each may receive separate, individually controllable, control signals from AGC control circuit 110.

In operation, the stages may be separately controlled. For example, all stages may begin operation at a maximum gain, and when the overall gain is to be reduced, the gain of a first stage may be reduced while the remaining stages maintain maximum gain. As the gain of the first stage approaches the minimum gain value, the gain of a second stage may be reduced, and so on. Accordingly, each stage may be controlled sequentially by AGC control circuit 110.

As the gain of one stage is reduced, its performance may degrade as measured by NF versus gain back off and intermodulation intercept versus gain back off. However, because the remaining stages continue to operate at maximum gain, the overall performance degradation is reduced. Further, in some embodiments, as succeeding stages approach minimum gain, they may be shut down completely so as to not contribute to the performance degradation.

AGC control circuit 110 may be any type of circuit capable of providing control signals to the AGC stages. In some embodiments, compound AGC circuit 100 is a "feedforward" AGC, and AGC control circuit 110 produces control signals in response to the amplitude of the input signal on node 102. In other embodiments, compound AGC circuit 100 is a "feedback" AGC, and AGC control circuit 110 produces control signals in response to the amplitude of the output signal on node 104. The manner in which AGC control circuit 110 is implemented is not a limitation of the present invention.

Figure 2:
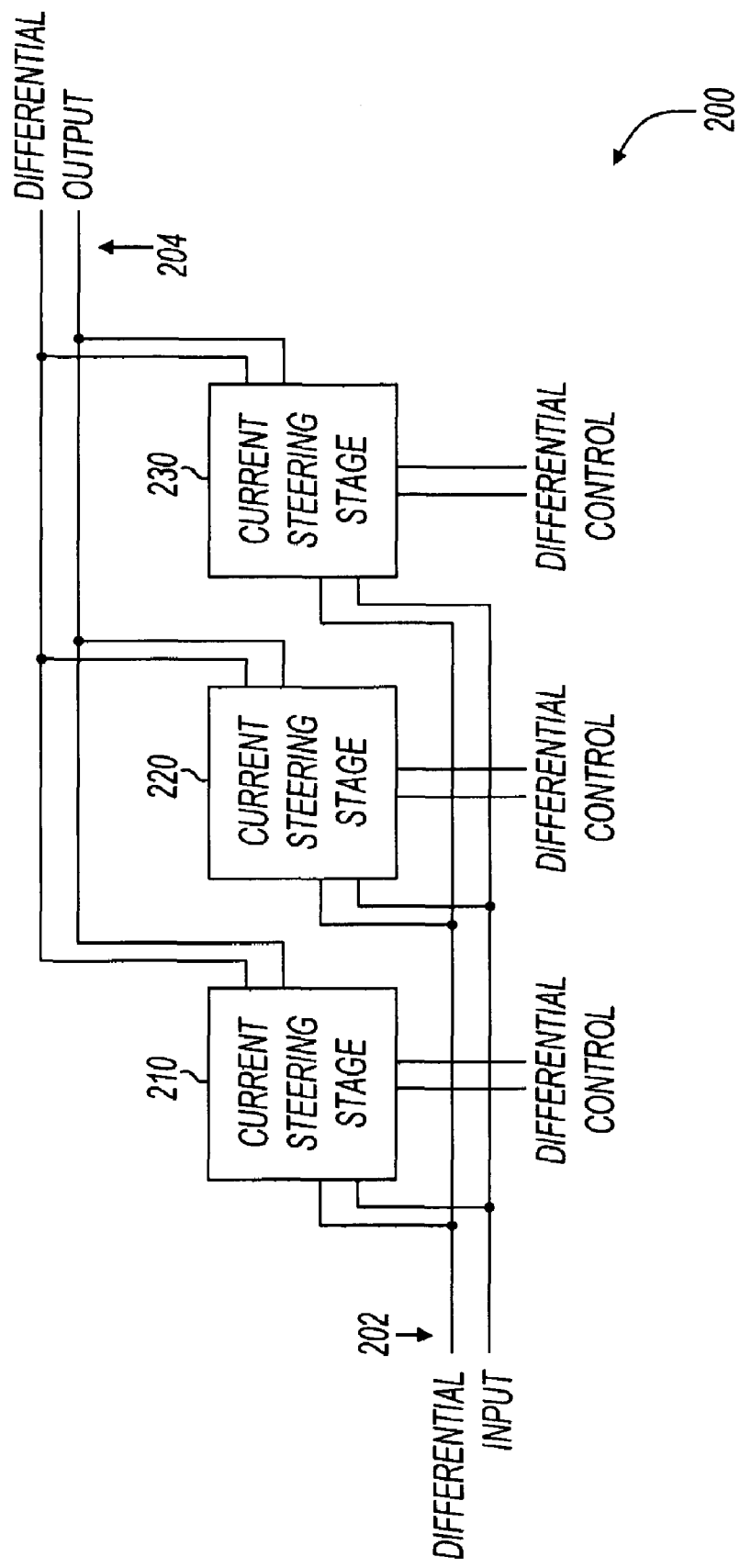
FIG. 2 shows a compound automatic gain control circuit having three current steering stages.

FIG. 2 shows a compound automatic gain control circuit having three current steering stages. Compound AGC circuit 200 includes current steering stages 210, 220, and 230. Each of current steering stages 210, 220, and 230 are coupled in parallel between differential input nodes 202 and differential output nodes 204. Further, each of current steering stages 210, 220, and 230 receives a separate differential control signal.

Figure 3:
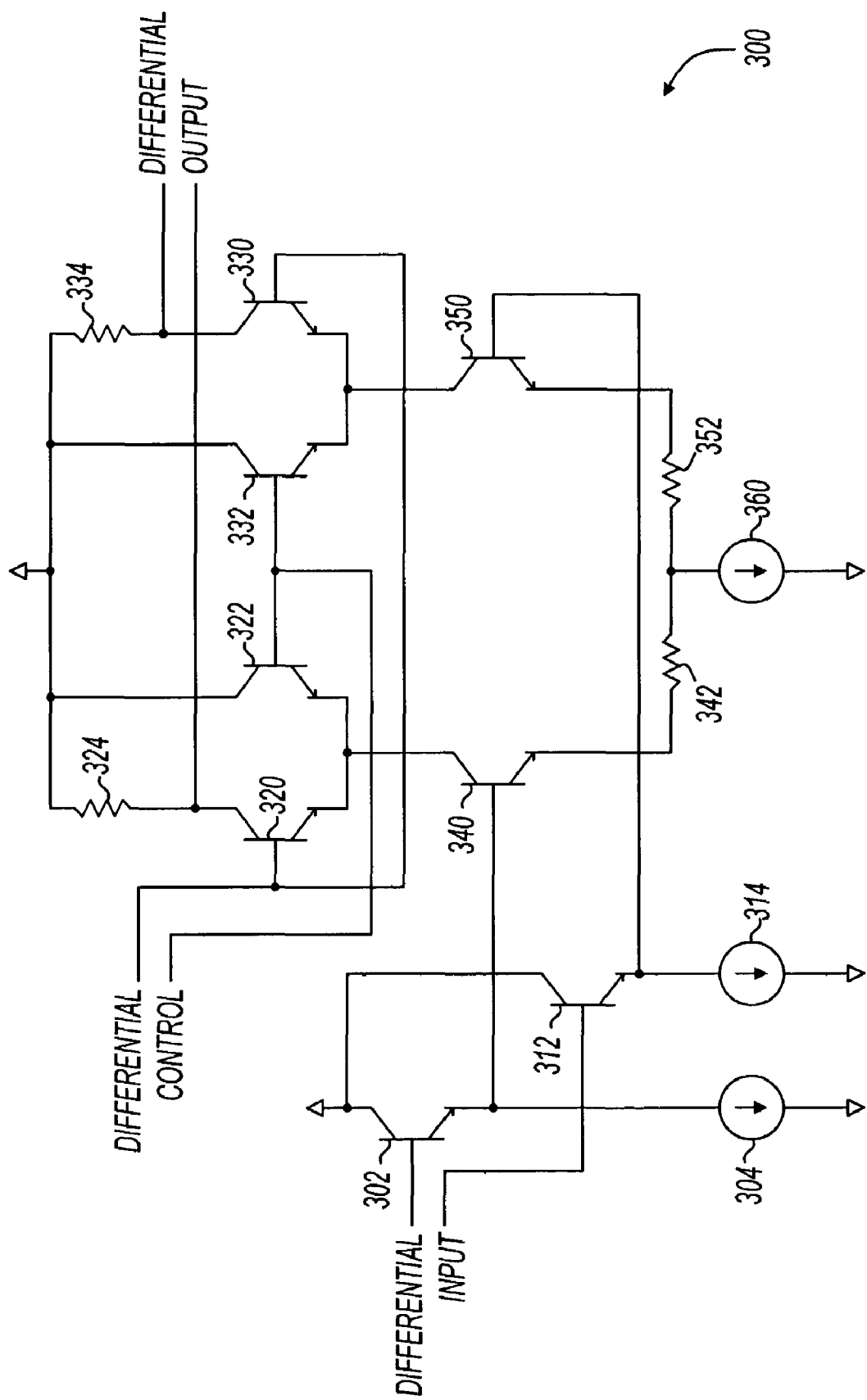
FIG. 3 shows a schematic of a current steering automatic gain control stage in accordance with various embodiments of the present invention.

Current steering stages 210, 220, and 230 operate by steering current away from internal load devices to reduce gain. An example current steering stage is shown in FIG. 3. The differential control signals are manipulated by a control circuit (not shown) such that firstly stage 210 backs off; then when stage 210 is substantially at minimum gain, stage 220 starts to back off; and then when stage 220 is substantially at minimum gain, stage 230 starts to back off. When the gain is to be increased, the opposite occurs. For example, the differential control signals are manipulated such that firstly the gain of stage 230 increases; then when stage 230 is substantially at maximum gain, the gain of stage 220 increases; and then when the gain of stage 220 is substantially at maximum gain, the gain of stage 210 increases.

As each stage decreases in gain, its NF and intermodulation intercept performance may decrease. However, because each stage only contributes one third of the total output signal, the NF and intermodulation intercept performance of the entire AGC circuit is largely driven by the performance of the other stages which are still at maximum gain and so delivering optimum performance.

FIG. 3 shows a schematic of a current steering automatic gain control stage in accordance with various embodiments of the present invention. Current steering stage 300 includes transistors 302, 312, 320, 322, 330, 332, 340, and 350, current sources 304, 314, and 360, and resistors 342, 352, 324, and 334. Resistors 324 and 334 operate as load devices, and resistors 342 and 352 operate as degeneration resistors.

Transistors 340 and 350 in combination with resistors 342 and 352 and current source 360 form a transconductance circuit. The transconductance circuit outputs a differential current from the collectors of transistors 340 and 350 that contains a dynamic current proportional to the differential input voltage and inversely proportional to the degeneration resistance of resistors 342 and 352 and a standing current equal to $I_1/2$.

The output current of the transconductance circuit is then fed to the common emitter point of two symmetric differential pairs of transistors. Transistors 320 and 322 form a first differential transistor pair, and transistors 330 and 332 form a second differential transistor pair. The two differential transistor pairs share a common differential control signal fed to the bases of the transistors, and each of the differential transistor pairs has a load resistor in one half of the differential circuit.

The control signals and outputs are arranged such that an increasing control voltage causes a decrease in both the currents output from transistor 320 flowing to resistor 324 and from transistor 330 flowing to resistor 334. The decrease in differential current flowing to resistors 324 and 334 leads to a decrease in the differential signal swing on the differential output, thus achieving an AGC function.

Current steering AGC stage 300 also includes transistors 302 and 312 and current sources 304 and 314. This additional pair of transistors may be included to provide isolation to the transconductance circuit. This may provide an improvement in the Noise Figure, but the various embodiments of the present invention are not limited in this regard.

The transistors shown in FIG. 3 are shown as bipolar junction transistors (BJTs), and specifically as NPN bipolar junction transistors. Other types of current steering or amplifying elements may be utilized for the various transistors of circuit 300 without departing from the scope of the present invention. For example, the transistors of circuit 300 may be field effect transistors (FETs), metal oxide semiconductor field effect transistors (MOSFETs), junction field effect transistors (JFETs), metal semiconductor field effect transistors (MESFETs), or any device capable of performing as described herein.

Current steering stage 300 may be utilized in a compound AGC circuit having two or more parallel stages. For example, current steering stage 300 may be utilized in compound AGC circuit 200 having three current steering stages. In some embodiments the tail current $I_1$ is the same in each stage, and in other embodiments, the tail current $I_1$ is not the same in each stage. In still further embodiments, the tail current $I_1$ may be variable in different stages.

In some embodiments, tail currents may be ratioed. For example, a lower tail current $I_1$ may be provided in an AGC stage that is backed off first, and a higher tail current may be provided in an AGC stage that is backed off last, with appropriate ratioing of tail currents for stages between the first and last.

In some embodiments, degeneration resistors may be ratioed. For example, smaller degeneration resistors may be provided in an AGC stage that is backed off first, and larger degeneration resistors may be provided in an AGC stage that is backed off last, with appropriate ratioing of degeneration resistors for stages between the first and last. Further, in some embodiments, both tail current values and degeneration resistor values vary between AGC stages.

In some embodiments, the tail currents for each AGC stage may partially or completely turn off when the stage is backed off. In these embodiments, the current may be diverted into the remaining active stages. As an example, consider a four stage embodiment in which each stage has a tail current of I/4. At maximum gain the intermodulation intercept will be proportional to I/4. When the AGC is backed off and the current is all turned in to a single stage, then the current is I, so delivering a proportionally higher signal handling. The lower current at maximum gain also has the advantage of lower NF contribution from current related shot noise.

Figure 4:
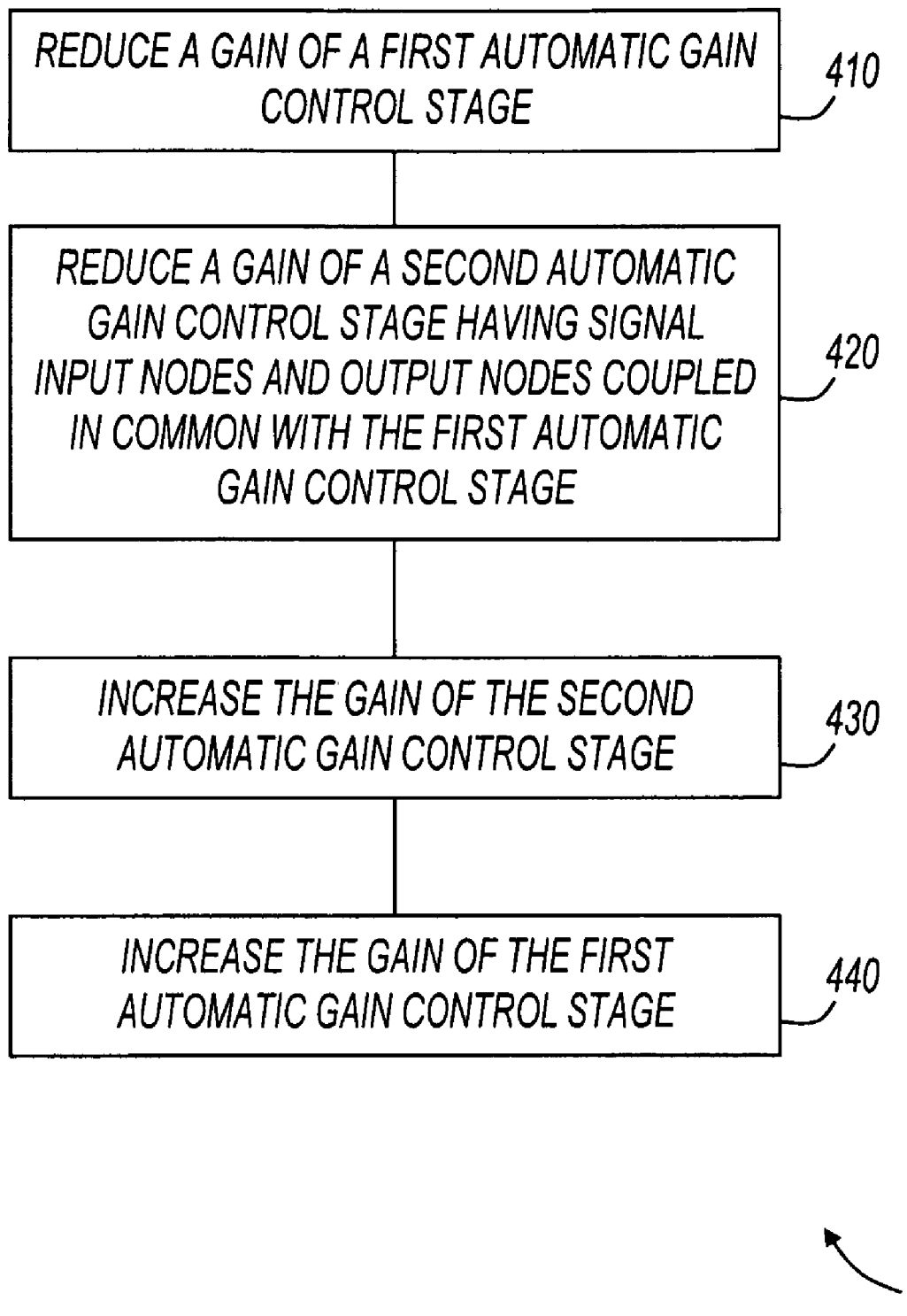
FIG. 4 shows a flowchart in accordance with various embodiments of the present invention.

FIG. 4 shows a flowchart in accordance with various embodiments of the present invention. In some embodiments, method 400, or portions thereof, is performed by a compound AGC circuit or an AGC control circuit, embodiments of which are shown in previous figures. In other embodiments, method 400 is performed by an integrated circuit or an electronic system. Method 400 is not limited by the particular type of apparatus performing the method. The various actions in method 400 may be performed in the order presented, or may be performed in a different order. Further, in some embodiments, some actions listed in FIG. 4 are omitted from method 400.

Method 400 is shown beginning with block 410 in which a gain of a first automatic gain control stage is reduced. At 420, a gain of a second automatic gain control stage is reduced. The second automatic gain control stage has signal input nodes and output nodes coupled in common with the first automatic gain control stage. The actions of 410 and 420 may correspond to backing off the gain of two of the AGC stages shown in FIG. 1. For example, control circuit 110 may cause the gain of AGC stage 120 to back off, and then cause the gain of AGC stage 130 to back off.

The AGC stages referred to in method 400 may or may not be current steering stages. For example, the actions of 410 and 420 may correspond to backing off the gain of two of the AGC stages shown in FIG. 2. The differential control of the current steering stage may cause current to be steered away from a load device within the current steering stage, thus reducing the gain of the stage.

In some embodiments, the gain of the first AGC stage is reduced until it reaches a substantially minimum gain value before starting to reduce the gain of the second AGC stage. Further, in some embodiments, the first AGC stage may be turned off completely.

At 430, the gain of the second automatic gain control stage is increased, and at 440, the gain of the first automatic gain control stage is increased. In embodiments that include current steering AGC stages, the gain may be increased Is by steering current back to the load devices. When increasing the gain of the compound AGC circuit, the gain of the second AGC stage may be increased until reaching a substantially maximum gain value before increasing gain of the first AGC stage.

Method 400 may operate to increase/decrease gain of more than two AGC stages. For example, method 400 may sequentially back off the gain of three AGC stages as shown in FIG. 2. Further, method 400 may sequentially back off the gain of "N" AGC stages as shown in FIG. 1.

Figure 5:
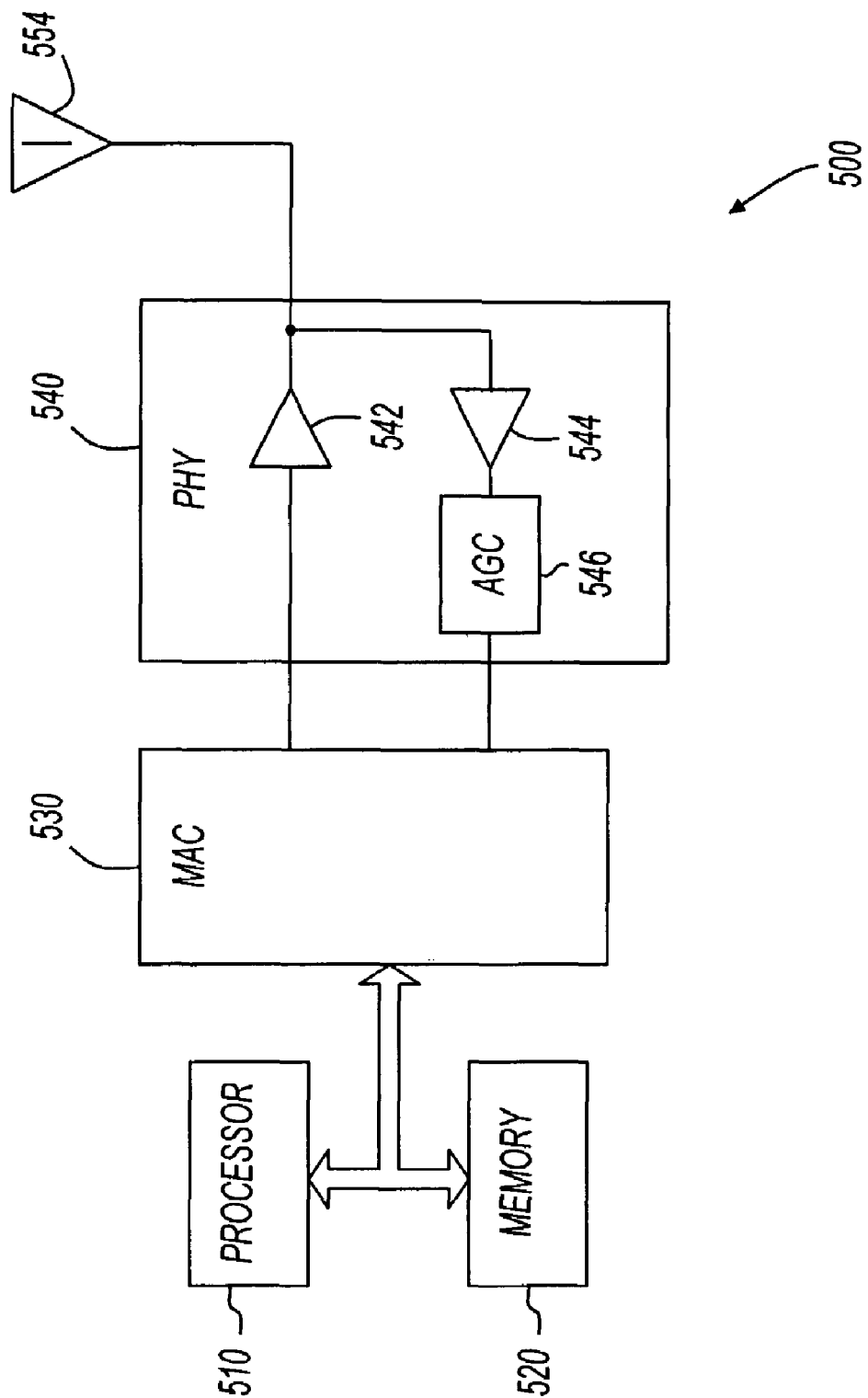
FIG. 5 shows a diagram of an electronic system in accordance with various embodiments of the present invention.

FIG. 5 shows a system diagram in accordance with various embodiments of the present invention. Electronic system 500 includes antenna 554, physical layer (PHY) 540, media access control (MAC) layer 530, processor 510, and memory 520. In operation, system 500 sends and receives signals using antenna 554, and the signals are processed by the various elements shown in FIG. 5.

Antenna 554 may include one or more antennas. For example, antenna 554 may include a single directional antenna or an omni-directional antenna. As used herein, the term omni-directional antenna refers to any antenna having a substantially uniform pattern in at least one plane. For example, in some embodiments, antenna 554 may include a single omni-directional antenna such as a dipole antenna, or a quarter wave antenna. Also for example, in some embodiments, antenna 554 may include a single directional antenna such as a parabolic dish antenna or a Yagi antenna. In still further embodiments, antenna 554 may include multiple physical antennas. For example, in some embodiments, multiple antennas are utilized for multiple-input-multiple-output (MIMO) processing or spatial-division multiple access (SDMA) processing.

Physical layer (PHY) 540 is coupled to antenna 554 to interact with other wireless devices. PHY 540 may include circuitry to support the transmission and reception of radio frequency (RF) signals. For example, as shown in FIG. 5, PHY 540 includes power amplifier (PA) 542, low noise amplifier (LNA) 544, and AGC 546. AGC 546 may be any of the compound AGC embodiments described herein. Further, in some embodiments, LNA 544 is omitted, and AGC 546 performs any needed amplification. In some embodiments, PHY 540 includes additional functional blocks to perform filtering, frequency conversion or the like.

PHY 540 may be adapted to transmit/receive and modulate/demodulate signals of various formats and at various frequencies. For example, PHY 540 may be adapted to receive time domain multiple access (TDMA) signals, code domain multiple access (CDMA) signals, global system for mobile communications (GSM) signals, orthogonal frequency division multiplexing (OFDM) signals, multiple-input-multiple-output (MIMO) signals, spatial-division multiple access (SDMA) signals, or any other type of communications signals. The various embodiments of the present invention are not limited in this regard.

Example systems represented by FIG. 5 include cellular phones, personal digital assistants, wireless local area network interfaces, wireless wide area network stations and subscriber units, cable television receivers, terrestrial television receivers, satellite receivers, and the like. Many other systems uses for compound AGC circuits exist. For example, AGC 546 may be used in a desktop computer, a network bridge or router, or any other system without an antenna.

Media access control (MAC) layer 530 may be any suitable media access control layer implementation. For example, MAC 530 may be implemented in software, or hardware or any combination thereof. In some embodiments, a portion of MAC 530 may be implemented in hardware, and a portion may be implemented in software that is executed by processor 510. Further, MAC 530 may include a processor separate from processor 510.

Processor 510 may be any type of processor capable of communicating with memory 520, MAC 530, and other functional blocks (not shown). For example, processor 510 may be a microprocessor, digital signal processor (DSP), microcontroller, or the like.

Memory 520 represents an article that includes a machine readable medium. For example, memory 520 represents a random access memory (RAM), dynamic random access memory (DRAM), static random access memory (SRAM), read only memory (ROM), flash memory, or any other type of article that includes a medium readable by processor 510. Memory 520 may store instructions for performing software driven tasks. Memory 520 may also store data associated with the operation of system 500.

Although the various elements of system 500 are shown separate in FIG. 5, embodiments exist that combine the circuitry of processor 510, memory 520, MAC 530, and all or a portion of PHY 540 in a single integrated circuit. For example, LNA 544 and AGC 546 may be combined together on an integrated circuit die. In some embodiments, the various elements of system 500 may be separately packaged and mounted on a common circuit board. In other embodiments, the various elements are separate integrated circuit dice packaged together, such as in a multi-chip module, and in still further embodiments, various elements are on the same integrated circuit die.

Compound AGC circuits, control circuits, and other embodiments of the present invention can be implemented in many ways. In some embodiments, they are implemented in integrated circuits as part of electronic systems. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, portions of AGC stage 300 (FIG. 3) may be represented as polygons assigned to layers of an integrated circuit.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. An automatic gain control circuit comprising:
    a first current steering stage having first input transistors with base nodes coupled as first stage input nodes, a first current source to source current to emitter nodes of the first input transistors, and first and second differential pairs of transistors coupled to collectors of the first input transistors to steer current and reduce a first stage gain;
    a second current steering stage having second input transistors with base nodes coupled as second stage input nodes and coupled in parallel with the first stage input nodes, a second current source to source current to emitter nodes of the second input transistors, and third and fourth differential pairs of transistors coupled to collectors of the second input transistors to steer current and reduce a second stage gain; and
    a control circuit coupled to the first, second, third, and fourth differential pairs of transistors to reduce the first stage gain independently of the second stage gain;
    wherein the first and second current steering stages are coupled to a common power supply.

2. The automatic gain control circuit of claim 1 wherein the first and second current sources source different current values.

3. The automatic gain control circuit of claim 1 further comprising first degeneration resistors coupled between the first current source and the first input transistors.

4. The automatic gain control circuit of claim 3 further comprising second degeneration resistors coupled between the second current source and the second input transistors.

5. The automatic gain control circuit of claim 4 wherein the first and second degeneration resistors have different values.

* * * * *